United States Patent
Shen et al.

(10) Patent No.: US 8,822,319 B2
(45) Date of Patent: Sep. 2, 2014

(54) METHOD OF MANUFACTURING NON-VOLATILE MEMORY

(75) Inventors: Cheng-Yen Shen, Taoyuan County (TW); Wein-Town Sun, Taoyuan County (TW)

(73) Assignee: eMemory Technology Inc., Hsinchu (TW)

( * ) Notice: Subject to any disclaimer, the term of this patent is extended or adjusted under 35 U.S.C. 154(b) by 42 days.

(21) Appl. No.: 13/610,875

(22) Filed: Sep. 12, 2012

(65) Prior Publication Data

US 2014/0073126 A1   Mar. 13, 2014

(51) Int. Cl.
*H01L 21/28* (2006.01)
(52) U.S. Cl.
USPC .......................................................... 438/561
(58) Field of Classification Search
None
See application file for complete search history.

(56) References Cited

U.S. PATENT DOCUMENTS

| | | | |
|---|---|---|---|
| 2006/0035432 A1* | 2/2006 | Kim et al. | 438/257 |
| 2007/0184606 A1* | 8/2007 | You et al. | 438/211 |
| 2008/0029806 A1* | 2/2008 | Takebuchi et al. | 257/315 |
| 2008/0142871 A1* | 6/2008 | Anezaki | 257/321 |
| 2008/0179677 A1* | 7/2008 | Murata et al. | 257/350 |
| 2009/0230460 A1* | 9/2009 | Yaegashi | 257/324 |
| 2013/0056819 A1* | 3/2013 | Matsushita et al. | 257/324 |

* cited by examiner

*Primary Examiner* — Charles Garber
*Assistant Examiner* — Stanetta Isaac
(74) *Attorney, Agent, or Firm* — Jianq Chyun IP Office

(57) ABSTRACT

A method of manufacturing a non-volatile memory is provided. A substrate includes a memory cell region and a first periphery circuit region. The memory cell region includes a select transistor region. A first gate dielectric layer having a first thickness is formed on the substrate in the first periphery circuit region and the select transistor region. A portion of the first gate dielectric layer on the select transistor region is removed to form a second gate dielectric layer. The second dielectric layer has a second thickness, wherein the second thickness is less than the first thickness.

9 Claims, 8 Drawing Sheets

METHOD OF MANUFACTURING NON-VOLATILE MEMORY

BACKGROUND OF THE INVENTION

1. Field of the Invention

The invention relates to a method of manufacturing a semiconductor device, and particularly to a method of manufacturing a non-volatile memory.

2. Description of Related Art

When semiconductor technology enters deep sub-micron manufacturing process, sizes of devices are gradually decreased, which means decreased memory cell size with respect to memory device. On the other hand, as data which information electronic products (such as computer, mobile phone, digital camera and personal digital assistant (PDA)) have to handle and store is increasing, the memory capacity required by these information electronic products becomes larger and larger. In the case of decreased device size and increased memory capacity demand, a common goal in the field is how to manufacture memory devices having decreased size and high integration while maintaining good qualities.

A non-volatile memory is capable of safeguarding stored data even after the power supplied to the non-volatile memory is cut off, and therefore the non-volatile memory has been extensively applied to personal computers and electronic equipments.

A typical non-volatile memory cell has a memory gate and a control gate made by doped polysilicon. A dielectric layer is disposed respectively between the memory gate and a substrate, and between the control gate and the substrate.

However, the manufacture of the above-mentioned non-volatile memory cell requires forming a plurality of polysilicon layers and a plurality of dielectric layers. During the manufacturing process, several photomasking steps are carried out, which not only lengthens the manufacturing process but also incurs more manufacturing cost.

A conventional NOR type non-volatile memory cell formed by two transistors connected in series includes a select transistor and a memory gate transistor. For this type of memory cell, there is no need to form a plurality of polysilicon layers. Hence the manufacturing process of such non-volatile memory cell can be integrated with the manufacturing process of a complementary metal oxide semiconductor transistor.

Generally, the non-volatile memory consists of a plurality of memory cells located in a memory cell region and a plurality of logic devices (such as input/output transistor, core transistor, etc.) located in a periphery circuit region. The select transistor and the input/output transistor in the periphery circuit region are manufactured in the same process. A gate dielectric layer of the input/output transistor is usually thicker for withstanding a higher operating voltage. However, in a situation where the sizes of devices are decreased due to increased integration of an integrated circuit, the size of the memory cell is decreased as well. If a thickness of a gate dielectric layer of the select transistor is equal to the thickness of the gate dielectric layer of the input/output transistor in the periphery circuit region, during operation of the memory, a larger voltage needs to be applied to a gate of the select transistor, with the result that a driving capability of a non-volatile memory device is reduced. Therefore, it will be an important issue that how to enable the non-volatile memory device to have a better driving capability.

SUMMARY OF THE INVENTION

In view of the foregoing, the invention proposes a method of manufacturing a non-volatile memory which effectively enhances a driving capability of a non-volatile memory device.

The invention provides a method of manufacturing a non-volatile memory. A substrate is provided. The substrate includes a memory cell region and a first periphery circuit region. The memory cell region includes a select transistor region. A first gate dielectric layer is formed on the substrate in the first periphery circuit region and the select transistor region. The first gate dielectric layer has a first thickness. A portion of the first gate dielectric layer on the select transistor region is removed, so as to form a second gate dielectric layer. The second gate dielectric layer has a second thickness, wherein the second thickness is less than the first thickness.

In an embodiment of the invention, the memory cell region includes a memory unit region. A charge storage structure is formed in the memory unit region. The charge storage structure includes a tunneling dielectric layer and a charge storage layer.

In an embodiment of the invention, a material of the charge storage layer includes doped polysilicon.

In an embodiment of the invention, the memory cell region includes a memory unit region. A charge storage structure is formed in the memory unit region. The charge storage structure includes a bottom dielectric layer, a charge trapping layer and a top dielectric layer.

In an embodiment of the invention, a thickness of the bottom dielectric layer is less than the second thickness of the second gate dielectric layer.

In an embodiment of the invention, a material of the charge trapping layer is selected from one of a group consisting of silicon nitride, silicon oxynitride, aluminium oxide, hafnium oxide, zirconium oxide, and other material which is able to store charge.

In an embodiment of the invention, the first gate dielectric layer is used as a gate dielectric layer of an input/output (I/O) transistor.

In an embodiment of the invention, a thickness of the first gate dielectric layer is 120 Å~130 Å, and a thickness of the second gate dielectric layer is 50 Å~70 Å.

In an embodiment of the invention, the step of removing the portion of the first gate dielectric layer on the select transistor region so as to form the second gate dielectric layer includes performing a lithographic etching process.

In an embodiment of the invention, the substrate further includes a second periphery circuit region. The first gate dielectric layer is formed on the substrate of the second periphery circuit region in the step of forming the first gate dielectric layer on the substrate in the first periphery circuit region and the select transistor region. The first gate dielectric layer on the second periphery circuit region is removed. A third gate dielectric layer is formed on the substrate on the second periphery circuit region. The third gate dielectric layer has a third thickness, wherein the third thickness is less than the second thickness.

In an embodiment of the invention, the memory cell region includes a memory unit region. A charge storage structure is formed in the memory unit region. The charge storage structure includes a tunneling dielectric layer and a charge storage layer.

In an embodiment of the invention, a material of the charge storage layer includes doped polysilicon.

In an embodiment of the invention, the memory cell region includes a memory unit region. A charge storage structure is formed in the memory unit region. The charge storage structure includes a bottom dielectric layer, a charge trapping layer and a top dielectric layer; or a bottom dielectric layer and a charge storage layer.

In an embodiment of the invention, a material of the charge trapping layer is selected from one of a group consisting of silicon nitride, silicon oxynitride, aluminium oxide, hafnium oxide, zirconium oxide, and other material which is able to store charge.

In an embodiment of the invention, the first gate dielectric layer is a gate dielectric layer of an input/output (I/O) transistor, and the third gate dielectric layer is used as a gate dielectric layer of a core transistor.

In an embodiment of the invention, a thickness of the first gate dielectric layer is 120 Å~130 Å, a thickness of the second gate dielectric layer is 50 Å~70 Å, and a thickness of the third gate dielectric layer is 15 Å~40 Å.

In an embodiment of the invention, the step of removing the first gate dielectric layer on the second periphery circuit region includes performing a lithographic etching process. The step of forming the third gate dielectric layer on the substrate on the second periphery circuit region includes performing a thermal oxidation process.

Based on the above, in the method of manufacturing a non-volatile memory proposed by the invention, the thickness of a gate dielectric layer of the select transistor of a memory cell is less than that of a gate dielectric layer of the input/output (I/O) transistor. With a gate dielectric layer having such thickness (50 Å~70 Å), the select transistor of the memory cell has a high driving current, such that the memory unit will have a high driving capability and a high information guidance speed.

In addition, by means of the method of manufacturing a non-volatile memory proposed by the invention, gate dielectric layers of a core transistor which have different thicknesses (15 Å~40 Å) can be manufactured. The core transistor is capable of withstanding a low operating voltage. The method of manufacturing a non-volatile memory proposed by the invention can manufacture various transistors having gate dielectric layers of different thicknesses.

In order to make the aforementioned and other features and advantages of the invention more comprehensible, embodiments accompanied with figures are described in detail below.

DESCRIPTION OF EMBODIMENTS

First Embodiment

FIG. 1A to FIG. 1E are cross-sectional schematic diagrams of a process of manufacturing a non-volatile memory according to the first embodiment of the invention.

Figure 1A:
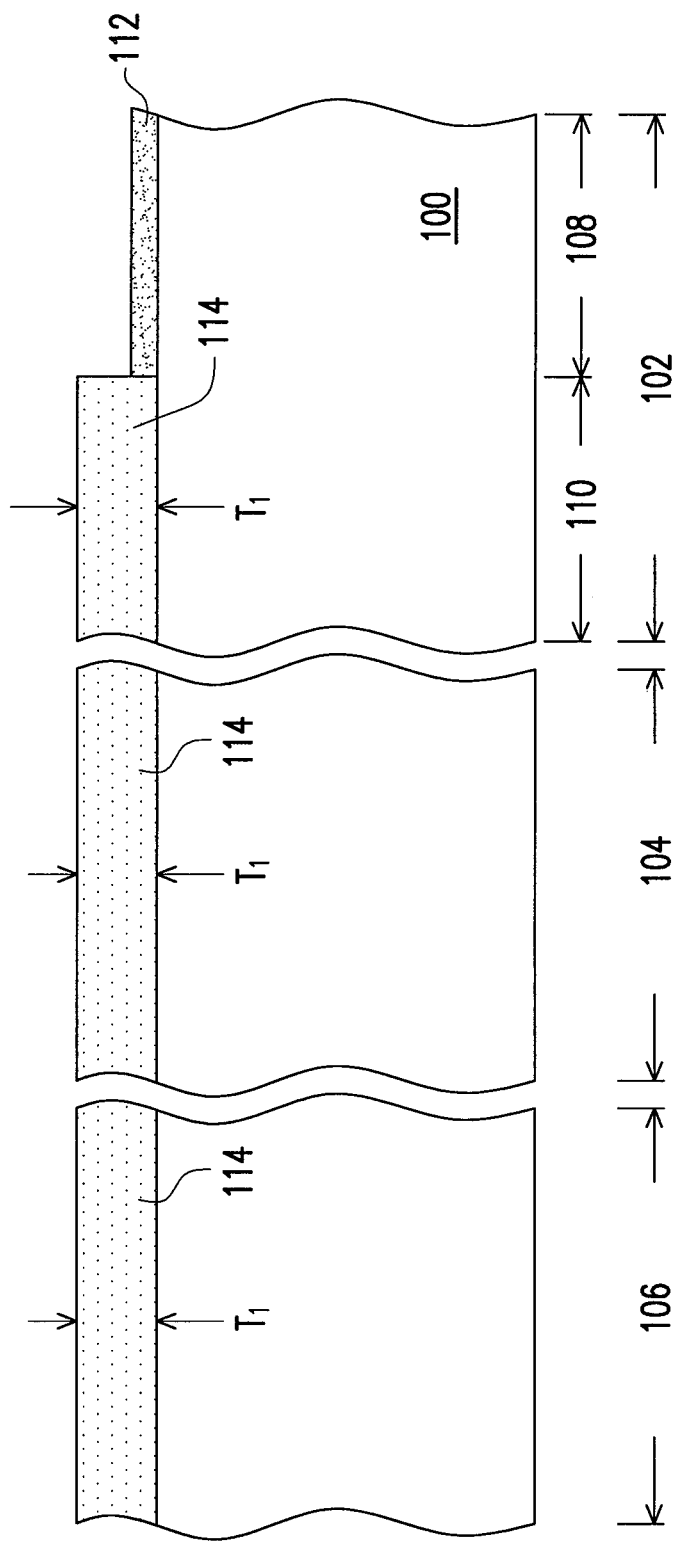
FIG. 1A to FIG. 1E are cross-sectional schematic diagrams of a process of manufacturing a non-volatile memory according to an embodiment of the invention.

Referring to FIG. 1A, first, a substrate 100 is provided. The substrate 100 is, for example, a silicon substrate having an n-type dopant or a p-type dopant. The substrate 100 includes a memory cell region 102, a first periphery circuit region 104 and a second periphery circuit region 106.

In the substrate 100, a plurality of isolation structures (not illustrated), for example, have been formed. The isolation structures are, for example, shallow trench isolation (STI) structures. The isolation structures isolate the memory cell region 102, the first periphery circuit region 104 and the second periphery circuit region 106. The first periphery circuit region 104 and the second periphery circuit region 106 are, for example, used to form transistors with different voltage characteristics.

In this embodiment, the memory cell region 102 includes a memory unit region 108 and a select transistor region 110. A tunneling dielectric layer 112 is formed in the memory unit region 108. A material of the tunneling dielectric layer 112 includes silicon oxide, and a forming method thereof includes a thermal oxidation method or a chemical vapor deposition method. A thickness of the tunneling dielectric layer 112 is approximately 20 Å~130 Å. The step of forming the tunneling dielectric layer 112 in the memory unit region 108 is, for example, forming a dielectric layer (not illustrated) on the substrate 100 first, and then removing the dielectric layer on the substrate 100 in the first periphery circuit region 104, the second periphery circuit region 106 and the select transistor region 110 by using a lithographic etching technique, only leaving the tunneling dielectric layer 112 in the memory unit region 108.

Then, a first gate dielectric layer 114 is formed on the substrate 100 in the first periphery circuit region 104, the second periphery circuit region 106 and the select transistor region 110. A material of the first gate dielectric layer 114 is, for example, silicon oxide, and a forming method thereof includes performing a thermal oxidation process or a chemical vapor deposition method in a furnace tube. In addition, in this embodiment, the first gate dielectric layer 114 has a first thickness T1, and the first thickness T1 is approximately 120 Å~130 Å. In this embodiment, the first gate dielectric layer 114 is manufactured by a manufacturing process of a gate dielectric layer of an input/output (I/O) transistor in a manufacturing process of a combined metal oxide semiconductor (CMOS) device.

Figure 1B:
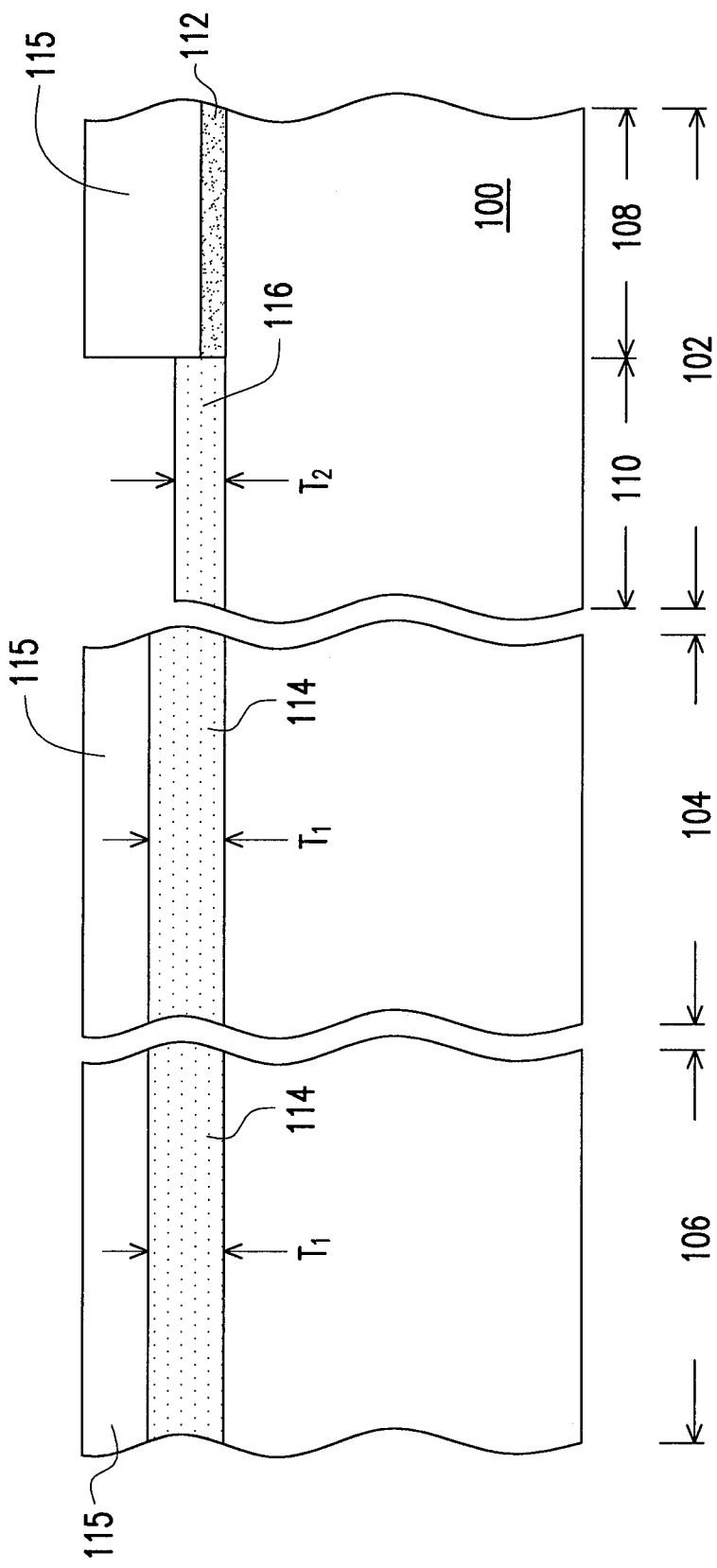

Referring to FIG. 1B, a patterned mask layer 115 is formed on the substrate 100. A material of the patterned mask layer 115 is, for example, a photoresist material. The patterned mask layer 115 exposes the first gate dielectric layer 114 in the select transistor region 110. The patterned mask layer 115 is formed by, for example, a lithography technique. By using the patterned mask layer 115 as a mask, a portion of the first gate dielectric layer 114 in the select transistor region 110 is removed to form a second gate dielectric layer 116. The above-mentioned removal process includes an etching process, such as a dry etching process or a wet etching process. The wet etching process uses hydrofluoric acid, for example, as an etchant. In the above-mentioned removal process, a feedback system (not illustrated) is employed to control a second thickness T2 of the second gate dielectric layer 116. The feedback system includes a monitor pattern and a short cycle measurement chip; that is, after an etching is performed, whether or not the second gate dielectric layer 116 achieves a desired thickness is confirmed, and if the desired thickness is not achieved, the etching will continue until the desired thickness is achieved. The second thickness T2 is less than the first thickness T1, and the second thickness T2 is approximately 50 Å~70 Å. As the second gate dielectric layer 116 is a film obtained by removing a portion of thickness of the first gate dielectric layer 114, a material of the second gate dielectric layer 116 is substantially the same as the material of the first gate dielectric layer 114.

Figure 1C:
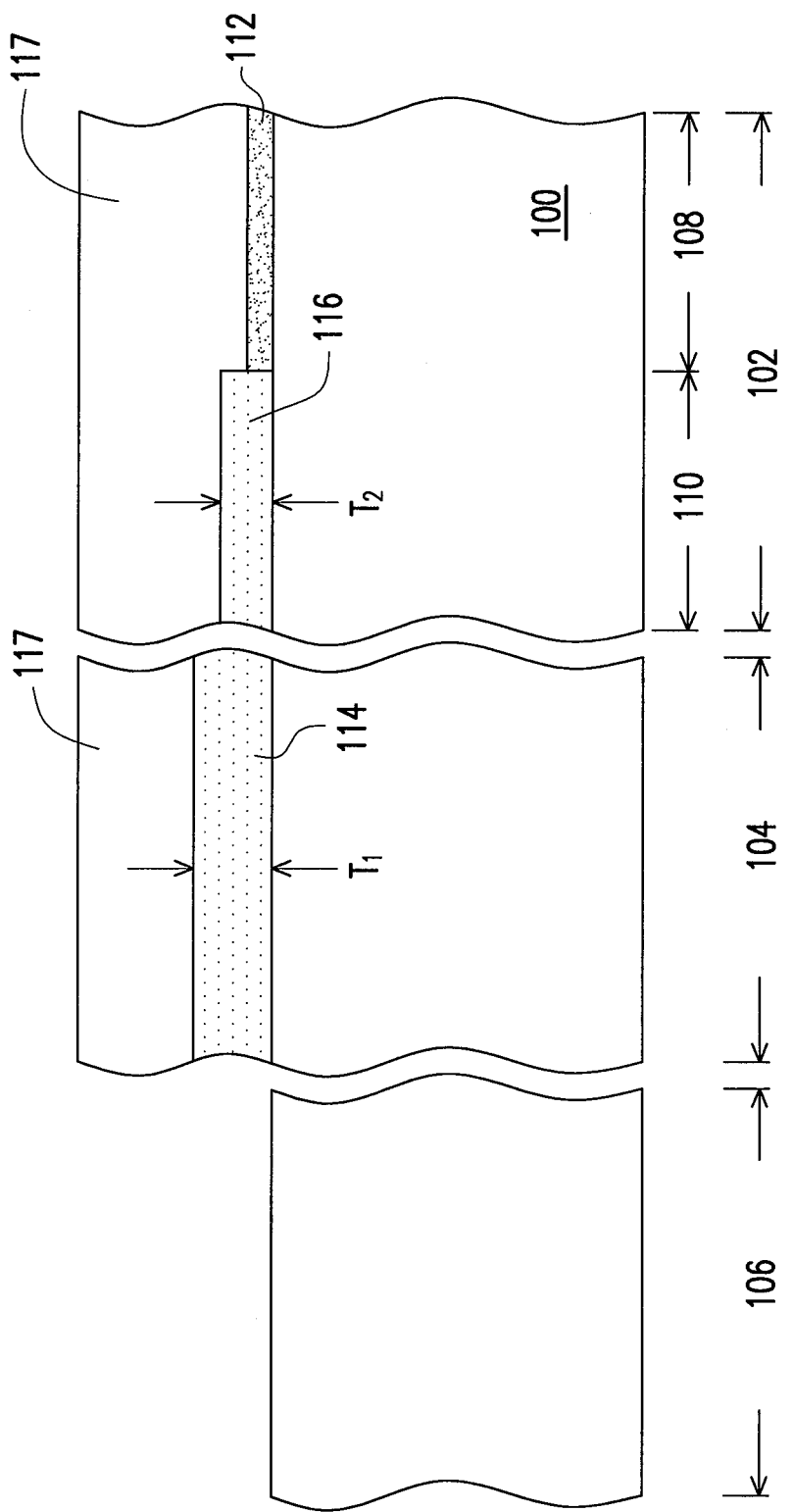

Referring to FIG. 1C, the patterned mask layer 115 is removed. The method of removing the patterned mask layer 115 is, for example, removing most photoresists by an ashing process first, and then removing the remaining photoresists by a cleaning process. A patterned mask layer 117 is formed on the substrate 100. The patterned mask layer 117 exposes the first gate dielectric layer 114 in the second periphery circuit region 106. By using the patterned mask layer 117 as a mask, all of the first gate dielectric layers 114 in the second periphery circuit region 106 are removed to expose the substrate 100 in the second periphery circuit region 106. The above-mentioned removal step includes performing an etching process, such as a dry etching process or a wet etching process. The wet etching process uses hydrofluoric acid, for example, as an etchant.

Figure 1D:
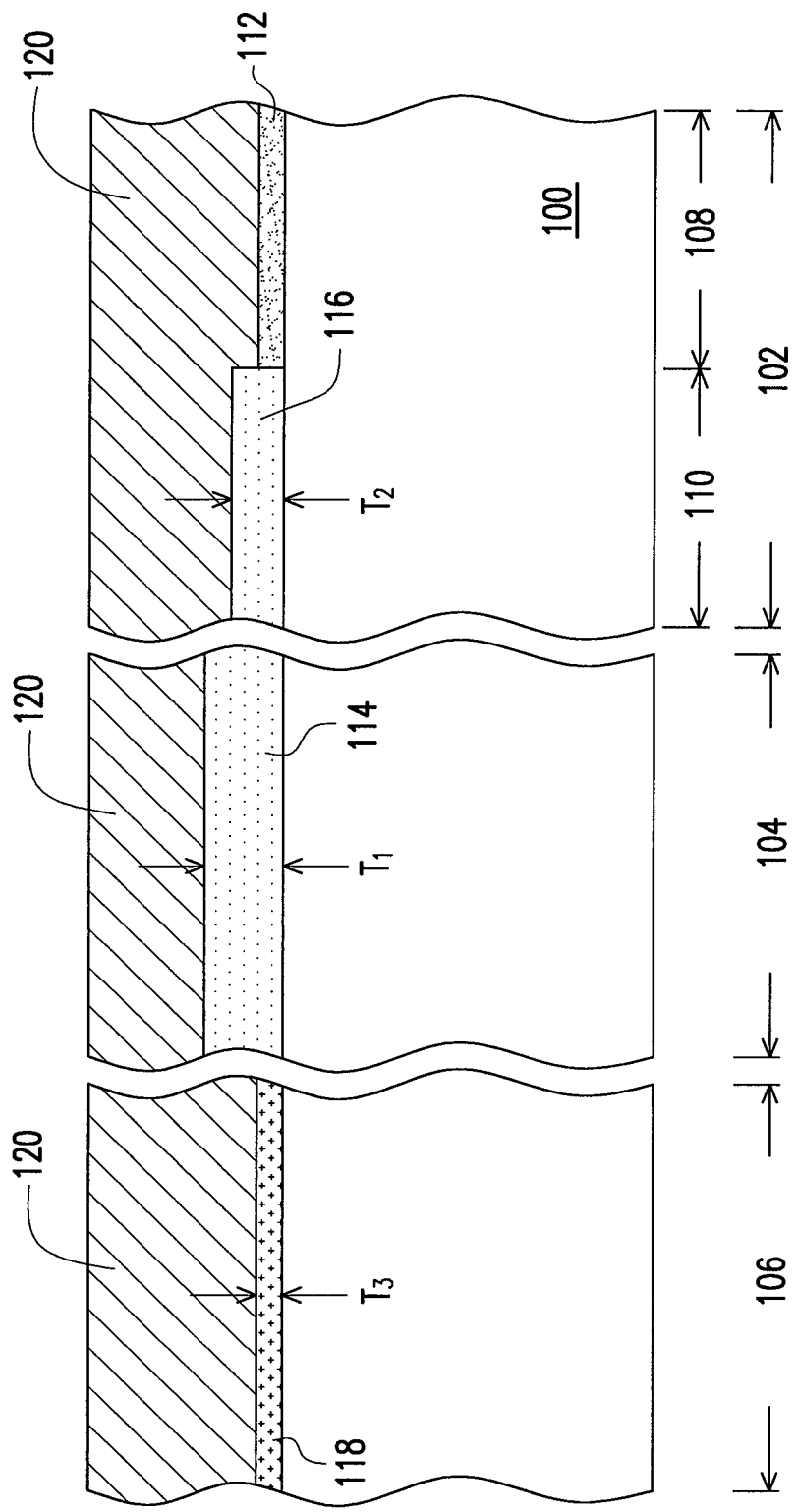

Referring to FIG. 1D, the patterned mask layer 117 is removed. The method of removing the patterned mask layer 117 is, for example, removing most photoresists by an ashing process first, and then removing the remaining photoresists by a cleaning process. A third gate dielectric layer 118 is formed on the substrate 100 in the second periphery circuit region 106. A material of the third gate dielectric layer 118 is, for example, silicon oxide, and a forming method thereof includes performing a thermal oxidation process in a furnace tube. The third gate dielectric layer 118 has a third thickness T3, and the third thickness T3 is less than the second thickness T2. In this embodiment, the third thickness T3 is approximately 15 Å~40 Å. In this embodiment, the third gate dielectric layer 118 is manufactured by a manufacturing process of a gate dielectric layer of a core transistor in a manufacturing process of a combined metal oxide semiconductor (CMOS) device.

It is worth noting that in the invention, after the first gate dielectric layer 114 in the second periphery circuit region 106 is completely removed, the third gate dielectric layer 118 is formed on the substrate 100 in the second periphery circuit region 106. Therefore, the third gate dielectric layer 118 and the first gate dielectric layer 114 belong to different films formed by different manufacturing processes. By means of such manufacturing method, the formed third gate dielectric layer 118 can avoid from being affected by the above-mentioned manufacturing processes, and can have a better quality. Next, a conductive layer 120 is formed on a whole of the substrate 100. A material of the conductive layer 120 is, for example, doped polysilicon. The conductive layer 120 is formed by, for example, performing an ion implantation step after forming an undoped polysilicon layer by a chemical vapor deposition method, or utilizing a chemical vapor deposition method in a manner of in situ implanting a dopant.

Figure 1E:
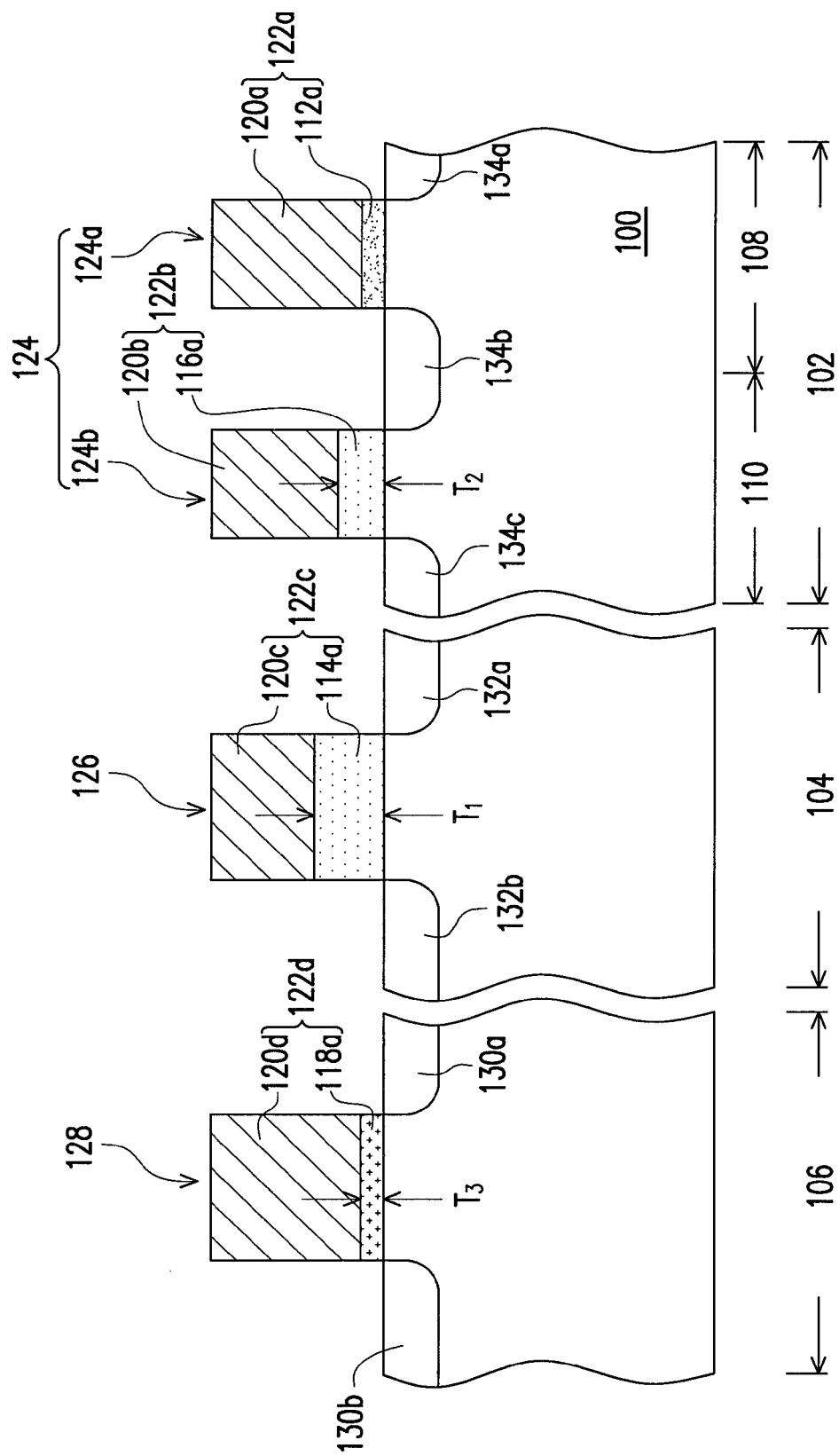

Referring to FIG. 1E, the conductive layer 120, the tunneling dielectric layer 112, the second gate dielectric layer 116, the first gate dielectric layer 114 and the third gate dielectric layer 118 are patterned, and gate structures 122a~122d are formed on the memory unit region 108, the select transistor region 110, the first periphery circuit region 104 and the second periphery circuit region 106, respectively. The gate structure 122a (charge storage structure) consists of, for example, a gate 120a and a tunneling dielectric layer 112a. The gate structure 122b consists of for example, a gate 120b and a second gate dielectric layer 116a. The gate structure 122c consists of, for example, a gate 120c and a first gate dielectric layer 114a. The gate structure 122d consists of, for example, a gate 120d and a third gate dielectric layer 118a.

Next, a dopant implantation step is performed, and a source region 130a and a drain region 130b are formed in the substrate 100 at two sides of the gate structure 122d; a source region 132a and a drain region 132b are formed in the substrate 100 at two sides of the gate structure 122c; doped regions 134a~134c are formed in the substrate 100 at two sides of the gate structure 122a and the gate structure 122b.

The dopant implantation step is, for example, implanting a dopant in the substrate 100 by an ion implantation method. The gate structure 122d, the source region 130a and the drain region 130b compose a transistor 128 (such as a core transistor in this embodiment); the gate structure 122c, the source region 132a and the drain region 132b compose a transistor 126 (such as an input/output (I/O) transistor in this embodiment); the gate structure 122a, the gate structure 122b and the doped regions 134a-134c compose a memory cell 124, wherein the gate structure 122b, the doped region 134b and the doped region 134c compose a select transistor 124b, and the gate structure 122a, the doped region 134a and the doped region 134b compose a memory gate transistor 124a. The follow-up manufacturing processes to complete a memory are well-known to persons skilled in the art and an explanation thereof is omitted here.

Second Embodiment

Figure 2A:
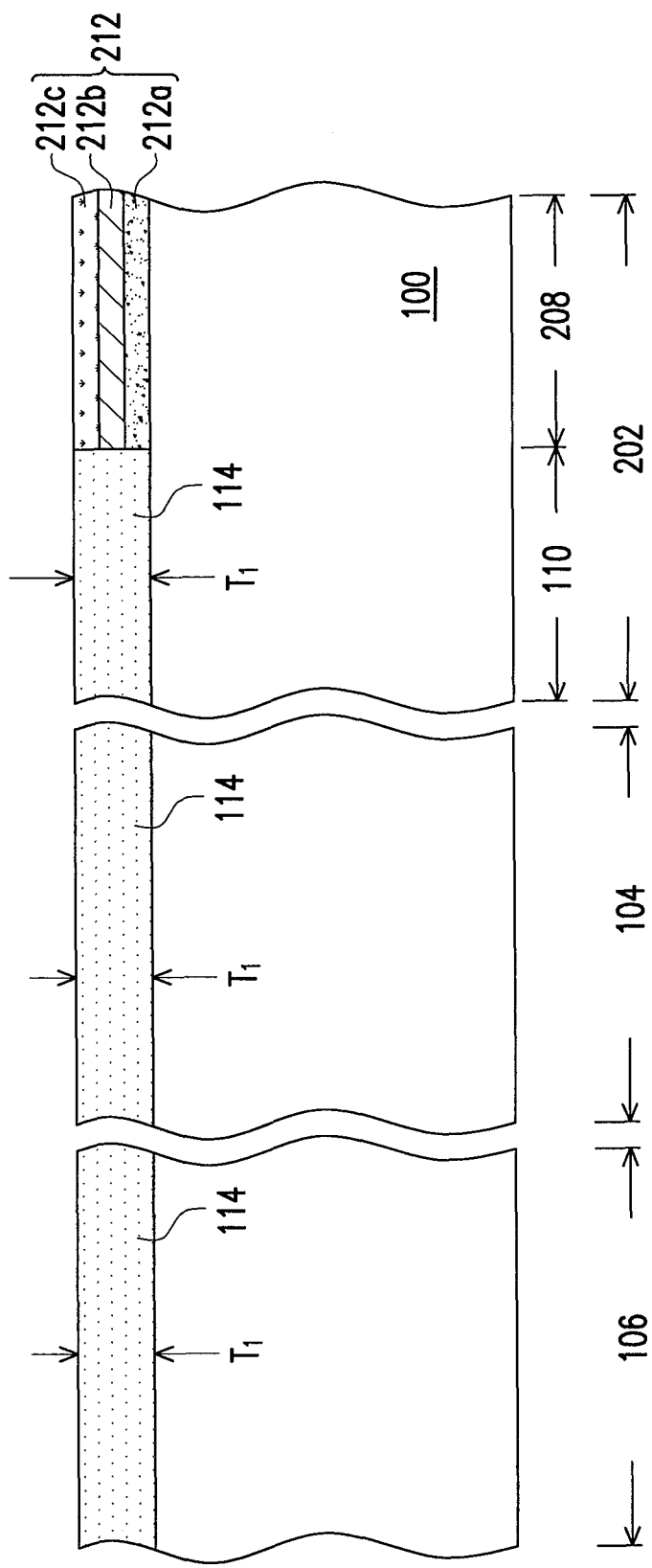
FIG. 2A to FIG. 2C are cross-sectional schematic diagrams of a process of manufacturing a non-volatile memory according to another embodiment of the invention.
Figure 2B:
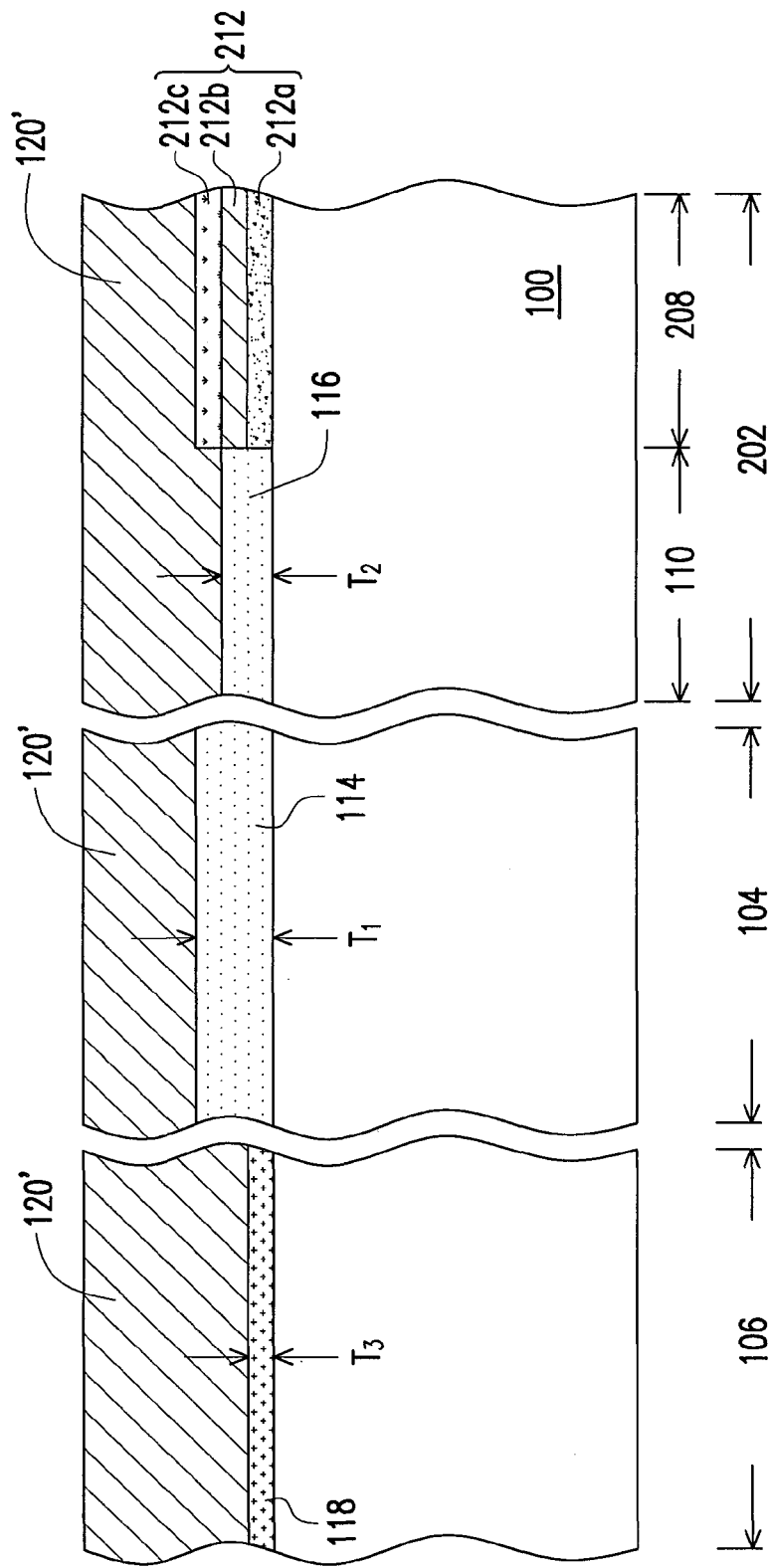
Figure 2C:
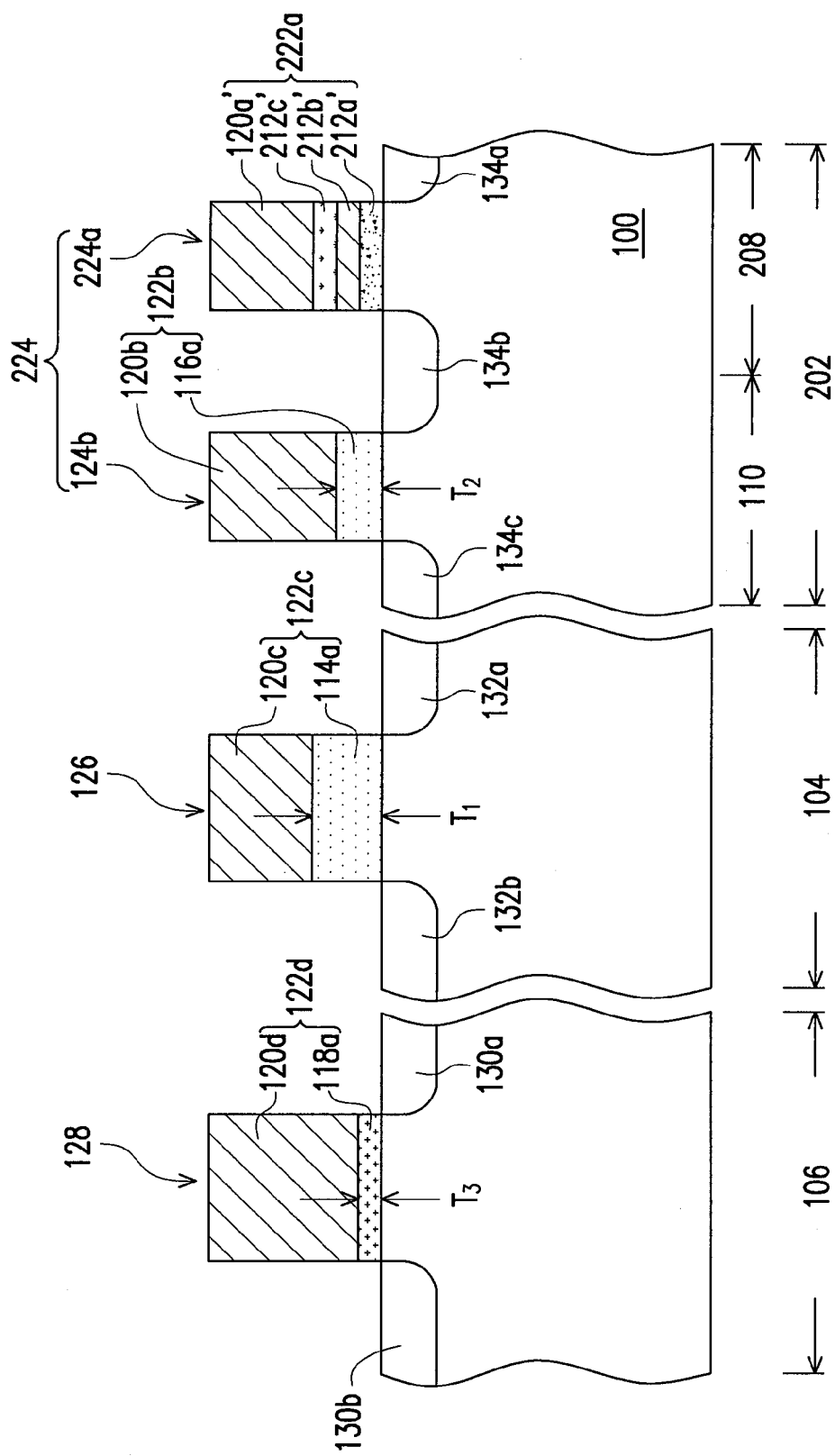

FIG. 2A to FIG. 2C are cross-sectional schematic diagrams of a process of manufacturing a non-volatile memory according to the second embodiment of the invention. Since the second embodiment is similar to the first embodiment, the same devices are labeled with the same reference numerals and explanations thereof will not be repeated.

First, referring to FIG. 2A, in this embodiment, the substrate 100 includes a memory cell region 202, the first periphery circuit region 104 and the second periphery circuit region 106. It is worth noting that the memory cell region 202 includes a memory unit region 208 and the select transistor region 110. A charge storage structure 212 is formed in the memory unit region 208. The charge storage structure 212 includes a bottom dielectric layer 212a, a charge trapping layer 212b and a top dielectric layer 212c. A material of the bottom dielectric layer 212a includes silicon oxide, and a forming method thereof includes performing a thermal oxidation process. In this embodiment, the charge trapping layer 212b is a material capable of trapping a charge therein, which is selected from one of a group consisting of silicon nitride, silicon oxynitride, aluminium oxide, hafnium oxide, zirconium oxide, and other material which is able to store charge. A forming method of the charge trapping layer 212b includes a chemical vapor deposition method. A material of the top dielectric layer 212c includes silicon oxide, and a forming method thereof includes a chemical vapor deposition method.

In this embodiment, the step of forming the charge storage structure 212 in the memory unit region 208 is, for example, forming a bottom dielectric layer (not illustrated), a charge trapping layer (not illustrated) and a top dielectric layer (not illustrated) in sequence on the substrate 100 first, and then removing the top dielectric layer, the charge trapping layer and the bottom dielectric layer on the substrate 100 in the first periphery circuit region 104, the second periphery circuit region 106 and the select transistor region 110, by a lithographic etching process. The lithographic etching process only leaves the bottom dielectric layer 212a, the charge trapping layer 212b and the top dielectric layer 212c in the memory unit region 208, which compose the charge storage structure 212.

Next, the first gate dielectric layer 114 is formed on the substrate 100 in the first periphery circuit region 104, the second periphery circuit region 106 and the select transistor region 110 by the manufacturing process in the first embodiment. Therefore, the first gate dielectric layer 114 in this embodiment is the same as the first gate dielectric layer 114 in the first embodiment, and an explanation thereof is omitted here.

Referring to FIG. 2B, the second gate dielectric layer 116 is formed by the manufacturing process in the first embodiment (as shown in FIG. 1B to FIG. 1C). A thickness of the second gate dielectric layer 116 is greater than a thickness of the bottom dielectric layer 212*a*. Next, the third gate dielectric layer 118 is formed by the manufacturing process in the first embodiment (as shown in FIG. 1D to FIG. 1E). Therefore, the substrate 100 in FIG. 2B includes the charge storage structure 212, the first gate dielectric layer 114, the second gate dielectric layer 116 and the third gate dielectric layer 118. In this embodiment, all of the first gate dielectric layer 114, the second gate dielectric layer 116 and the third gate dielectric layer 118 are the same as their counterparts in the first embodiment.

Next, a conductive layer 120' is formed on a whole of the substrate 100, and a material and a forming method of the conductive layer 120' are both the same as those of the conductive layer 120 in the first embodiment. However, in this embodiment, the conductive layer 120' covers the memory cell region 202 and the memory unit region 208, while in the first embodiment, the conductive layer 120 covers the memory cell region 102 and the memory unit region 108. That is, except for the different coverage areas, the conductive layer 120' is substantially the same as the conductive layer 120.

Referring to FIG. 2C, the conductive layer 120', the charge storage structure 212, the second gate dielectric layer 116, the first gate dielectric layer 114 and the third gate dielectric layer 118 are patterned, and a gate structure 222*a* as well as the gate structures 122*b*~122*d* are formed on the memory unit region 108, the select transistor region 110, the first periphery circuit region 104 and the second periphery circuit region 106, respectively. The gate structure 222*a* includes a gate 120*a'*, a top dielectric layer 212*c'*, a charge trapping layer 212*b'* and a bottom dielectric layer 212*a'*.

Next, a dopant implantation step is performed, and the source region 130*a* and the drain region 130*b* are formed in the substrate 100 at two sides of the gate structure 122*d*; the source region 132*a* and the drain region 132*b* are formed in the substrate 100 at two sides of the gate structure 122*c*; the doped regions 134*a*~134*c* are formed in the substrate 100 at two sides of the gate structure 222*a* and the gate structure 122*b*. The dopant implantation step is, for example, implanting a dopant in the substrate 100 by an ion implantation method. The gate structure 122*d*, the source region 130*a* and the drain region 130*b* compose the transistor 128 (such as a core transistor in this embodiment); the gate structure 122*c*, the source region 132*a* and the drain region 132*b* compose the transistor 126 (such as an input/output (I/O) transistor in this embodiment); the gate structure 222*a*, the gate structure 122*b*, and the doped regions 134*a*~134*c* compose a memory cell 224, wherein the gate structure 122*b*, the doped region 134*b* and the doped region 134*c* compose the select transistor 124*b*, and the gate structure 222*a*, the doped region 134*a* and the doped region 134*b* compose a memory unit transistor 224*a*. In this embodiment, all of the transistor 128 (such as a core transistor), the transistor 126 (such as an input/output (I/O) transistor) and the select transistor 124*b* are the same as their counterparts in the first embodiment, and thus an explanation thereof is omitted here. The follow-up manufacturing processes to complete a memory are well-known to persons skilled in the art and an explanation thereof is omitted here.

In the first embodiment and the second embodiment, the thickness (approximately 50 Å~70 Å) of the second gate dielectric layer 116*a* of the select transistor 124*b* is less than the thickness of the first gate dielectric layer 114*a* of the transistor 126 (such as an input/output (I/O) transistor). Moreover, the thickness T2 of the second gate dielectric layer 116*a* of the select transistor 124*b* is approximately 50 Å~70 Å, and thus a driving voltage of the select transistor 124*b* is lower than a driving voltage of the transistor 126 (such as an input/output (I/O) transistor). In addition, the manufacturing method of the invention can be applied to the manufacture of n-type or p-type non-volatile memory, and can be integrated with a manufacturing process of a combined metal oxide semiconductor (CMOS) device.

The invention back etches the first gate dielectric layer 114 by a lithographic etching process, and monitors the above-mentioned manufacturing process in combination with the feedback system. Therefore, the second gate dielectric layer 116 having a required less thickness can be manufactured. The second gate dielectric layer 116 forms a dielectric layer of the select transistor by integrating the follow-up manufacturing processes, resulting in that the select transistor has a higher driving current than I/O transistor. In addition, the invention removes the first gate dielectric layer 114 in the second periphery circuit region 106 by lithographic etching, then forms the third gate dielectric layer 118 having a less thickness, and then manufactures a transistor having a further higher driving current and a higher information guidance speed. According to the method of manufacturing a non-volatile memory of the invention, various transistors having gate dielectric layers of different thicknesses can be manufactured and used as devices of periphery circuits.

In summary, the method of manufacturing a non-volatile memory of the invention reduces a thickness of a gate dielectric layer of a select transistor without increasing complexity of the manufacturing process, such that a driving current of a memory cell is highered and an information guidance speed thereof is improved, and an advantage of enhancing an operation speed of a non-volatile memory device is accomplished. On the other hand, the invention utilizes different manufacturing processes to manufacture a gate dielectric layer of a core transistor and a gate dielectric layer of an input/output (I/O) transistor, so as to form periphery circuit transistors having different driving capabilities. Moreover, the manufactured core transistor with the gate dielectric layer having a less thickness has a better quality and a higher driving current. Therefore, a non-volatile memory manufactured by the manufacturing method of the invention will have a higher driving capability than I/O transistor and can be applied to design with higher integration.

It will be apparent to those skilled in the art that various modifications and variations can be made to the structure of the disclosed embodiments without departing from the scope or spirit of the invention. In view of the foregoing, it is intended that the invention cover modifications and variations of this invention provided they fall within the scope of the following claims and their equivalents.

What is claimed is:

1. A method of manufacturing a non-volatile memory, comprising:

providing a substrate comprising a memory cell region, a first periphery circuit region and a second periphery circuit region, the memory cell region comprising a select transistor region;

forming a first gate dielectric layer on the substrate in the first periphery circuit region and the select transistor region, the first gate dielectric layer having a first thickness;

removing a portion of the first gate dielectric layer on the select transistor region to form a second gate dielectric layer having a second thickness, wherein the second thickness is less than the first thickness;

forming the first gate dielectric layer on the substrate of the second periphery circuit region in the step of forming the first gate dielectric layer on the substrate in the first periphery circuit region and the select transistor region;

removing the first gate dielectric layer on the second periphery circuit region; and forming a third gate dielectric layer on the substrate on the second periphery circuit region, the third gate dielectric layer having a third thickness, wherein the third thickness is less than the second thickness.

2. The method of manufacturing a non-volatile memory as claimed in claim 1, wherein the memory cell region comprises a memory unit region; and forming a charge storage structure in the memory unit region, the charge storage structure comprising a tunneling dielectric layer and a charge storage layer.

3. The method of manufacturing a non-volatile memory as claimed in claim 2, wherein a material of the charge storage layer comprises doped polysilicon.

4. The method of manufacturing a non-volatile memory as claimed in claim 1, wherein the memory cell region comprises a memory unit region; and forming a charge storage structure in the memory unit region, the charge storage structure comprising a bottom dielectric layer, a charge trapping layer and a top dielectric layer.

5. The method of manufacturing a non-volatile memory as claimed in claim 4, wherein a thickness of the bottom dielectric layer is less than the second thickness of the second gate dielectric layer.

6. The method of manufacturing a non-volatile memory as claimed in claim 4, wherein a material of the charge trapping layer is selected from one of a group consisting of silicon nitride, silicon oxynitride, aluminium oxide, hafnium oxide, zirconium oxide, and other material which is able to store charge.

7. The method of manufacturing a non-volatile memory as claimed in claim 1, wherein the first gate dielectric layer is a gate dielectric layer of an input/output (I/O) transistor, and the third gate dielectric layer is used as a gate dielectric layer of a core transistor.

8. The method of manufacturing a non-volatile memory as claimed in claim 1, wherein a thickness of the first gate dielectric layer is 120 Å~130 Å, a thickness of the second gate dielectric layer is 50 §~70 Å, and a thickness of the third gate dielectric layer is 15 Å~40 Å.

9. The method of manufacturing a non-volatile memory as claimed in claim 1, wherein the step of removing the first gate dielectric layer on the second periphery circuit region comprises performing a lithographic etching process; and the step of forming the third gate dielectric layer on the substrate on the second periphery circuit region comprises performing a thermal oxidation process.

\* \* \* \* \*